United States Patent
Yu et al.

(10) Patent No.: US 10,216,029 B2
(45) Date of Patent: Feb. 26, 2019

(54) PHOTOSENSITIVE RESIN COMPOSITION, BLACK COLUMN SPACER USING THE SAME AND COLOR FILTER

(71) Applicant: Samsung SDI Co., Ltd., Yongin-si (KR)

(72) Inventors: Arum Yu, Suwon-si (KR); Jin-Woo Park, Suwon-si (KR); Hojeong Paek, Suwon-si (KR); Junho Lee, Suwon-si (KR); Seungjib Choi, Suwon-si (KR); Hyunmoo Choi, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 115 days.

(21) Appl. No.: 15/051,941

(22) Filed: Feb. 24, 2016

(65) Prior Publication Data

US 2016/0282528 A1    Sep. 29, 2016

(30) Foreign Application Priority Data

Mar. 24, 2015    (KR) ........................ 10-2015-0040851

(51) Int. Cl.

| | |
|---|---|
| *G02F 1/1335* | (2006.01) |
| *G02B 5/20* | (2006.01) |
| *G03F 7/00* | (2006.01) |
| *G03F 7/032* | (2006.01) |
| *G03F 7/033* | (2006.01) |
| *G03F 7/038* | (2006.01) |
| *G03F 7/105* | (2006.01) |

(52) U.S. Cl.
CPC ....... *G02F 1/133512* (2013.01); *G02B 5/201* (2013.01); *G02F 1/133516* (2013.01); *G03F 7/0007* (2013.01); *G03F 7/032* (2013.01); *G03F 7/033* (2013.01); *G03F 7/038* (2013.01); *G03F 7/105* (2013.01)

(58) Field of Classification Search
USPC ................................. 252/586, 500
See application file for complete search history.

(56) References Cited

U.S. PATENT DOCUMENTS

2015/0183955 A1*  7/2015  Deno ............... G03F 7/0007
                                                  349/110

FOREIGN PATENT DOCUMENTS

| JP | 3005185 B2 | 1/2000 |
|---|---|---|
| JP | 3915201 B2 | 5/2007 |
| JP | 2008-286877 | * 11/2008 |
| JP | 2010-235739 A | 10/2010 |
| JP | 2012-167194 A | 9/2012 |
| JP | 5334403 A | 11/2013 |
| JP | 2013-257493 A | 12/2013 |
| JP | 5429114 A | 2/2014 |
| JP | 2014-063091 A | 4/2014 |
| JP | 5528712 B2 | 6/2014 |
| TW | 201232178 A | 8/2012 |
| TW | 201314366 A | 4/2013 |
| WO | WO2010038978 | * 4/2010 |

OTHER PUBLICATIONS

Search Report in counterpart Taiwanese Application No. 105106821 dated Dec. 19, 2016, pp. 1.

* cited by examiner

*Primary Examiner* — Monique R Peets
(74) *Attorney, Agent, or Firm* — Additon, Higgins & Pendleton, P.A.

(57) ABSTRACT

A photosensitive resin composition includes (A) a black colorant having a maximum transmittance in an ultraviolet (UV) wavelength range/minimum transmittance in a visible ray wavelength range of about 30 or greater, (B) a binder resin; (C) a photopolymerization initiator; (D) a photopolymerizable monomer; and (E) a solvent. A black column spacer using the photosensitive resin composition, and a color filter including the black column spacer are provided.

12 Claims, 4 Drawing Sheets

PHOTOSENSITIVE RESIN COMPOSITION, BLACK COLUMN SPACER USING THE SAME AND COLOR FILTER

CROSS-REFERENCE TO RELATED APPLICATION

This application claims priority to and the benefit of Korean Patent Application No. 10-2015-0040851 filed in the Korean Intellectual Property Office on Mar. 24, 2015, the entire disclosure of which is incorporated herein by reference.

FIELD

This disclosure relates to a photosensitive resin composition, a black column spacer using the same, and a color filter including the black column spacer.

BACKGROUND

A photosensitive resin composition can be used in the manufacture of a display device, such as a color filter, a liquid crystal display material, an organic light emitting diode, and/or a display panel material. For example, a color filter such as a color liquid crystal display can include a black matrix on the border of colored layers such as red, green, blue, and the like to enhance display contrast and/or chromophore effects. This light blocking layer may be formed of the photosensitive resin composition.

Recently, an attempt to use the black matrix material as a column spacer supporting two TFT's and a C/F substrate having a liquid crystal layer therebetween has been made. This column spacer is called a black column spacer.

The black column spacer uses a pigment capable of increasing optical density (OD) to obtain light-blocking properties. Since UV transmittance is also deteriorated, however, the black column spacer may be unfavorable for photocuring. In particular, the most generally-used pigment for the black column spacer, carbon black, has excellent light-blocking properties but UV transmittance of 0. Thus, this black spacer column can have a drawback of deteriorating a process margin, since surface curing with minimal or no internal curing found only in black can occur and then development is performed.

Accordingly, there is a need for a photosensitive resin composition for a black column spacer capable of minimizing or overcoming problems associated with prior compositions such as the above drawbacks.

SUMMARY OF THE INVENTION

One embodiment provides a photosensitive resin composition capable of securing light-blocking properties in a visible ray region and simultaneously transmittance in an ultraviolet (UV) region.

Another embodiment provides a black column spacer using the photosensitive resin composition.

Yet another embodiment provides a color filter including the black column spacer.

One embodiment provides a photosensitive resin composition including (A) a black colorant having a maximum transmittance in an ultraviolet (UV) wavelength range/minimum transmittance in a visible ray wavelength range of about 30 or greater; (B) a binder resin; (C) a photopolymerization initiator; (D) a photopolymerizable monomer; and (E) a solvent.

The ultraviolet (UV) wavelength range may be about 300 nm to about 400 nm.

The visible ray wavelength range may be about 500 nm to about 600 nm.

The maximum transmittance in an ultraviolet (UV) wavelength range may be greater than or equal to about 3%.

The minimum transmittance in a visible ray wavelength range may be less than or equal to about 0.1%.

The black colorant may be a mixture of two or more colorants selected from a red colorant, green colorant, a blue colorant, and/or a yellow colorant.

The red colorant, green colorant, blue colorant, violet colorant and yellow colorant may each be independently a pigment and/or a dye.

The binder resin may be a cardo-based binder resin, an acrylic-based binder resin, or a combination thereof.

The photosensitive resin composition may further include an epoxy-based monomer.

The epoxy-based monomer may be represented by the following Chemical Formula 3:

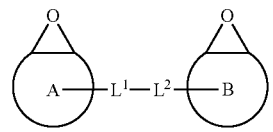

[Chemical Formula 3]

wherein, in Chemical Formula 3,

A and B are the same or different and are each independently a substituted or unsubstituted C3 to C10 cycloalkane, $L^1$ and $L^2$ are the same or different and are each independently a single bond, a substituted or unsubstituted C1 to C10 alkylene group, or *—C(=O)O—*.

The epoxy-based monomer may be included in an amount of about 0.1 wt % to about 5 wt % based on the total amount of the photosensitive resin composition.

The photosensitive resin composition may include about 5 wt % to about 20 wt % of the black colorant; about 5 wt % to about 20 wt % of the binder resin; about 0.1 wt % to about 5 wt % of the photopolymerization initiator; about 1 wt % to about 10 wt % of the photopolymerizable monomer; and a balance amount of the solvent based on the total amount of the photosensitive resin composition.

The photosensitive resin composition may further include an additive of malonic acid, 3-amino-1,2-propanediol, a silane-based coupling agent, a leveling agent, a fluorine-based surfactant, a radical polymerization initiator or a combination thereof.

Another embodiment provides a black column spacer manufactured by exposing and developing the photosensitive resin composition.

Yet another embodiment provides a color filter including the black column spacer.

Other embodiments of the present invention are included in the following detailed description.

The photosensitive resin composition according to one embodiment provides a black column spacer that can have both photosensitivity and light-blocking properties, and a color filter including the same due to a black colorant having light-blocking properties in a visible ray region and light transmittance in an ultraviolet (UV) region.

DETAILED DESCRIPTION

Figure 1:
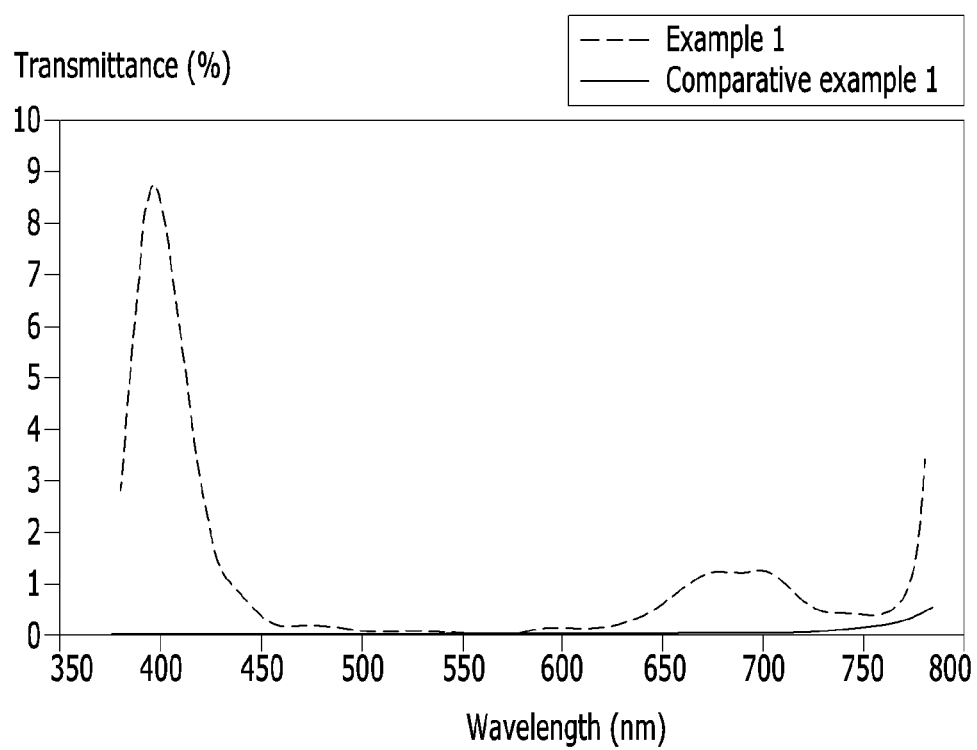
FIG. 1 is a graph showing transmittance depending on a wavelength of the black colorants used in Example 1 and Comparative Example 1.
Figure 2:
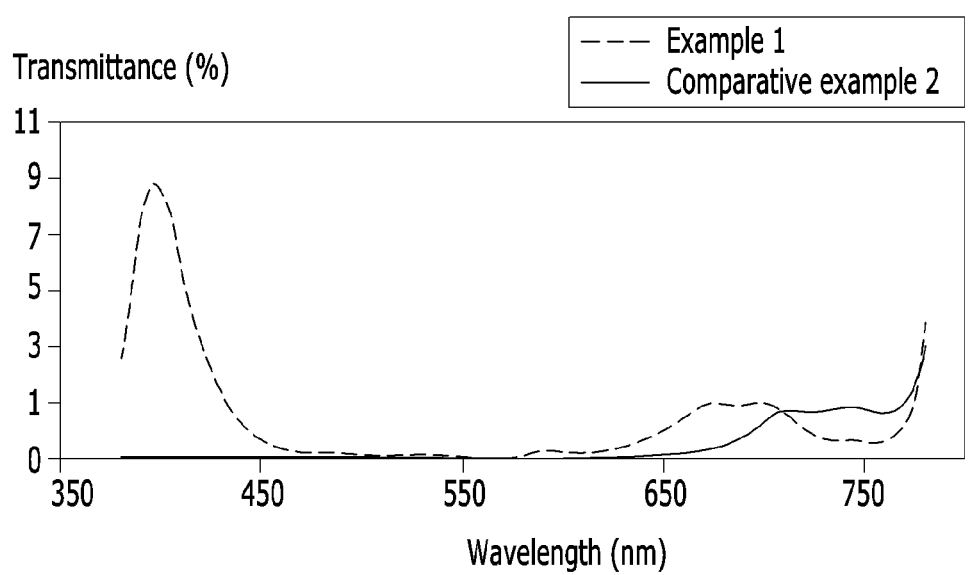
FIG. 2 is a graph showing transmittance depending on a wavelength of the black colorants used in Example 1 and Comparative Example 2.

The present invention will be described more fully hereinafter, in which exemplary embodiments of the present invention are shown. This invention may, however, be embodied in many different forms and should not be construed as limited to the exemplary embodiments set forth herein. These exemplary embodiments disclosed in this specification are provided so that this disclosure will satisfy applicable legal requirements.

As used herein, when a specific definition is not otherwise provided, the term "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when a specific definition is not otherwise provided, the term "substituted" refers to one substituted with a substituent selected from a halogen (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof, instead of at least one hydrogen.

As used herein, when a specific definition is not otherwise provided, the term "hetero" refers to one including at least one heteroatom selected from N, O, S and/or P in a Chemical Formula.

As used herein, when a specific definition is not otherwise provided, "(meth)acrylate" refers to both "acrylate" and "methacrylate", and "(meth)acrylic acid" refers to "acrylic acid" and "methacrylic acid".

As used herein, when a specific definition is not otherwise provided, the term "combination" refers to mixing and/or copolymerization.

As used herein, when a specific definition is not otherwise provided, an unsaturated bond includes a bond between other atoms such as a carbonyl bond, or an azo bond as well as a multi-bond between carbon-carbon atoms.

As used herein, a cardo-based resin refers to resin including at least one functional group selected from Chemical Formulae 1-1 to 1-11 in a backbone.

As used herein, when a specific definition is not otherwise provided, "*" indicates a point where the same or different atom or Chemical Formula is linked.

A photosensitive resin composition according to one embodiment includes a black colorant; binder resin; a photopolymerization initiator; a photopolymerizable monomer; and a solvent, wherein the black colorant has a maximum transmittance in an ultraviolet (UV) wavelength range/minimum transmittance in a visible ray wavelength range of about 30 or greater. Alternatively, the black colorant may have a maximum transmittance in an ultraviolet (UV) wavelength range/average transmittance in a visible ray wavelength range of about 30 or greater. Stated differently, the black colorant can have a ratio of the maximum transmittance in an ultraviolet (UV) wavelength range/average transmittance in a visible ray wavelength range of about 30 or greater.

A photosensitive resin composition used for a conventional black matrix or a black column spacer includes a black pigment having high optical density, for example carbon black in order to realize excellent light-blocking properties. However, a black pigment such as carbon black and the like can have improved light-blocking properties but also can have significantly reduced transmittance in an ultraviolet (UV) region and thus process margins cannot become large.

In contrast, a photosensitive resin composition according to one embodiment includes a black colorant having a maximum transmittance in an ultraviolet (UV) wavelength range/minimum transmittance in a visible ray wavelength range (or a maximum transmittance in an ultraviolet (UV) wavelength range/average transmittance in a visible ray wavelength range) of about 30 or greater, and thereby a black column spacer that can have both photosensitivity and light-blocking properties is provided.

Hereinafter, each component is described.

(A) Black Colorant

The black colorant is a dye, a pigment, or a combination thereof that has high transmittance in an ultraviolet (UV) region and simultaneously high light-blocking properties in a visible ray region.

The ultraviolet (UV) wavelength range may be about 300 nm to about 400 nm, for example about 340 nm to about 380 nm.

The visible ray wavelength range may be about 500 nm to about 600 nm, for example about 530 nm to about 570 nm.

The maximum transmittance in an ultraviolet (UV) wavelength range may be greater than or equal to about 3%, for example greater than or equal to about 5%, for example greater than or equal to about 3% and less than or equal to about 99%, for example greater than or equal to about 5% and less than or equal to about 99%. In some embodiments, the black colorant can have a maximum transmittance in an ultraviolet (UV) wavelength range of about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99%. Further, according to some embodiments of the present invention, the black colorant can have a maximum transmittance in an ultraviolet (UV) wavelength range of from about any of the foregoing amounts to about any other of the foregoing amounts.

The minimum transmittance in a visible ray wavelength range may be less than about 3%, for example less than or equal to about 0.1%, for example greater than about 0% and less than about 3%, for example greater than about 0% and less than or equal to about 0.1%. In some embodiments, the black colorant can have a minimum transmittance in a visible ray wavelength range of greater than about 0, about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, or 3%. Further, according to some embodiments of the present invention, the black colorant can have a minimum transmittance in a visible ray wavelength range of from about any of the foregoing amounts to about any other of the foregoing amounts.

That is, transmittance in an ultraviolet (UV) region of the black colorant may be larger than transmittance in a visible ray region.

The black colorant may be a mixture of two or more colorants, not a single colorant. For example, the black colorant may be a mixture of two or more colorants selected from a red colorant, a green colorant, a blue colorant, and/or a yellow colorant. As described above, the red colorant, the green colorant, the blue colorant, the violet colorant, and the yellow colorant may be each independently a pigment and/or a dye. Alternatively, the black colorant may be a mixed colorant of two or more black colorants such as aniline black, perylene black, titanium black, carbon black and the like.

Examples of the red colorant may include without limitation C.I. red pigment 254, C.I. red pigment 255, C.I. red pigment 264, C.I. red pigment 270, C.I. red pigment 272, C.I. red pigment 177, C.I. red pigment 89, and the like in a color index, and may be used singularly or as a mixture of two or more.

Examples of the green colorant may include without limitation a halogen-substituted copper phthalocyanine pigment such as C.I. green pigment 36, C.I. green pigment 7, and the like, G58, G59, and the like in a color index, and may be used singularly or as a mixture of two or more.

Examples of the blue colorant may include without limitation C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, 0.1 blue pigment 15:6, C.I. blue pigment 16 in a color index, and may be used singularly or as a mixture of two or more.

Examples of the violet colorant may include without limitation dioxazine violet, first violet B, methyl violet lake, indanthrene brilliant violet, and the like, and may be used singularly or as a mixture of two or more.

Examples of the yellow colorant may include without limitation an isoindoline-based pigment such as C.I. yellow pigment 139, C.I. a quinophthalone-based pigment such as yellow pigment 138, a nickel complex pigment such as C.I. yellow pigment 150 in a color index, and may be used singularly or as a mixture of two or more.

The colorant may be used as a mixture of two or more, and is not limited to the examples.

When the colorant is a pigment, a dispersing agent may be used therewith to disperse the pigment. The pigment may be pretreated with the dispersing agent on the surface or added therewith to prepare the composition.

The dispersing agent may be a non-ionic dispersing agent, an anionic dispersing agent, a cationic dispersing agent, and the like. Examples of the dispersing agent may include without limitation polyalkylene glycols and esters thereof, polyoxyalkylenes, polyhydric alcohol ester alkylene oxide addition products, alcohol alkylene oxide addition products, sulfonate esters, sulfonate salts, carboxylate esters, carboxylate salts, alkyl amide alkylene oxide addition products, alkyl amines, and the like, and these may be used singularly or as a mixture of two or more.

Commercially available examples of the dispersing agent may include without limitation DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, and/or DISPERBYK-2001 made by BYK Co., Ltd.; EFKA-47, EFKA-47EA, EFKA-48, EFKA-49, EFKA-100, EFKA-400, and/or EFKA-450 made by EFKA Chemicals Co.; Solsperse 5000, Solsperse 12000, Solsperse 13240, Solsperse 13940, Solsperse 17000, Solsperse 20000, Solsperse 24000GR, Solsperse 27000, and/or Solsperse 28000, and the like made by Zeneka Co.; and/or PB711 and/or PB821, and the like made by Ajinomoto Inc.

The dispersing agent may be included in an amount of about 0.1 wt % to about 15 wt % based on the total amount (total weight, 100 wt %) of the photosensitive resin composition. When the dispersing agent is included in an amount within the above range, the composition can have excellent stability, developability, and/or pattern-forming capability due to improved dispersion properties during manufacture of a black column spacer.

The pigment may be pre-treated using a water-soluble inorganic salt and a wetting agent. When the pigment is pre-treated, an average particle diameter of the pigment may become finer.

The pre-treatment may be performed by kneading the pigment with a water-soluble inorganic salt and a wetting agent and then filtering and washing the kneaded pigment.

The kneading may be performed at a temperature of about 40° C. to about 100° C., and the filtering and washing may be performed by filtering the pigment after washing away an inorganic salt with water and the like.

Examples of the water-soluble inorganic salt may sodium chloride and/or potassium chloride, and the like, but are not limited thereto. The wetting agent may allow the pigment to be uniformly mixed with the water-soluble inorganic salt and be pulverized.

Examples of the wetting agent include without limitation alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used singularly or as a mixture of two or more.

The pigment after the kneading may have an average particle diameter ranging from about 5 nm to about 200 nm, for example about 5 nm to about 150 nm. When the pigment has an average particle diameter within the above range, stability of pigment dispersion may be improved and pixel resolution may not be deteriorated.

The pigment may be used in a form of pigment dispersion including the dispersing agent and a solvent which will be described later, and the pigment dispersion may include a solid pigment, a dispersing agent, and a solvent.

The photosensitive resin composition can include the black colorant in an amount of about 5 wt % to about 20 wt %, for example about 7 wt % to about 15 wt %, based on the total amount (total weight, 100 wt %) of the photosensitive resin composition. In some embodiments, the photosensitive resin composition can include the black colorant in an amount of about 5, 6, 7, 8, 9, 10, 11, 12, 13, 14, 15, 16, 17, 18, 19, or 20 wt %. Further, according to some embodiments of the present invention, the amount of the black colorant can be in a range from about any of the foregoing amounts to about any other of the foregoing amounts.

When the black colorant is included in an amount within the above range, coloring effects and/or development performance may be improved.

(B) Binder Resin

The binder resin may include a cardo-based binder resin, an acrylic-based binder resin, or a combination thereof.

When the binder resin in the photosensitive resin composition includes a cardo-based binder resin, the composition can have excellent developability and/or sensitivity during photo-curing and thus can have fine pattern-forming capability. When the cardo-based binder resin is used, reliability of black column spacer may be ensured.

The cardo-based binder resin may include a repeating unit represented by the following Chemical Formula 1:

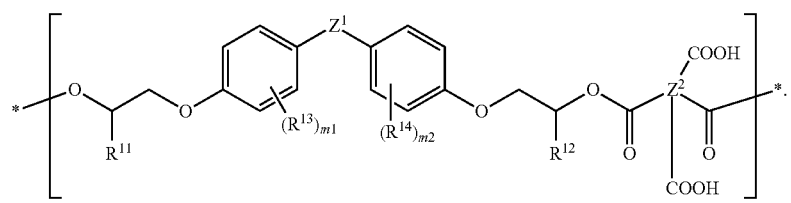

[Chemical Formula 1]

In Chemical Formula 1, $R^{11}$ and $R^{12}$ are the same or different and are each independently hydrogen or a substituted or unsubstituted (meth)acryloyloxy alkyl group, $R^{13}$ and $R^{14}$ are the same or different and are each independently hydrogen, a halogen, or a substituted or unsubstituted C1 to C20 alkyl group, each $Z^1$ is independently a single bond, O, CO, $SO_2$, $CR^7R^8$, $SiR^9R^{10}$ (wherein $R^7$ to $R^{10}$ are the same or different and are each independently hydrogen or a substituted or unsubstituted C1 to C20 alkyl group), or a linking group represented by one or more of the following Chemical Formulae 1-1 to 1-11:

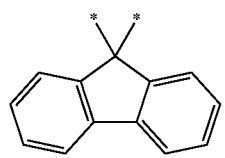

[Chemical Formula 1-1]

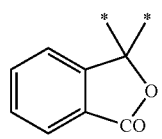

[Chemical Formula 1-2]

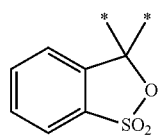

[Chemical Formula 1-3]

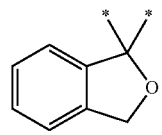

[Chemical Formula 1-4]

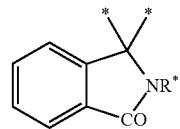

[Chemical Formula 1-5]

wherein in Chemical Formulae 1-5, $R^a$ is hydrogen, an ethyl group, $C_2H_4Cl$, $C_2H_4OH$, $CH_2CH=CH_2$, or a phenyl group,

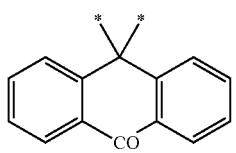

[Chemical Formula 1-6]

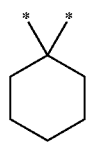

[Chemical Formula 1-7]

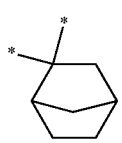

[Chemical Formula 1-8]

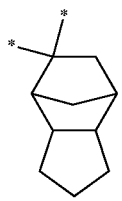

[Chemical Formula 1-9]

[Chemical Formula 1-10]

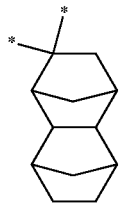

[Chemical Formula 1-11]

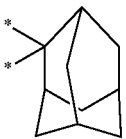

each $Z^2$ is independently an acid dianhydride residual group, and m1 and m2 are the same or different and are each independently an integer ranging from 0 to 4.

The cardo-based binder resin may include a functional group represented by the following Chemical Formula 2 at at least one terminal end:

[Chemical Formula 2]

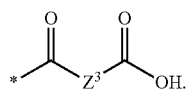

In Chemical Formula 2, $Z^3$ is represented by the following Chemical Formulae 2-1 to 2-7:

[Chemical Formula 2-1]

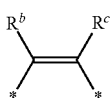

wherein in Chemical Formula 2-1, $R^b$ and $R^c$ are the same or different and are each independently, hydrogen, a substituted or unsubstituted C1 to C20 alkyl group, an ester group, or an ether group,

[Chemical Formula 2-2]

[Chemical Formula 2-3]

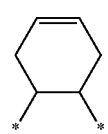

[Chemical Formula 2-4]

[Chemical Formula 2-5]

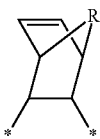

wherein in Chemical Formula 2-5, Rd is O, S, NH, a substituted or unsubstituted C1 to C20 alkylene group, C1 to C20 alkylamine group, or C2 to C20 alkenylamine group,

[Chemical Formula 2-6]

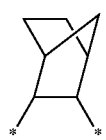

[Chemical Formula 2-7]

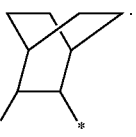

The cardo-based resin may be, for example, prepared by mixing at least two of a fluorene-containing compound such as 9,9-bis (4-oxiranylmethoxyphenyl)fluorene, and the like; an anhydride compound such as benzenetetracarboxylic acid dianhydride, naphthalenetetracarboxylic acid dianhydride, biphenyltetracarboxylic acid dianhydride, benzophenonetetracarboxylic acid dianhydride, pyromellitic dianhydride, cyclobutanetetracarboxylic acid dianhydride, perylenetetracarboxylic acid dianhydride, tetrahydrofurantetracarboxylic acid dianhydride, tetrahydrophthalic anhydride, and the like; a glycol compound such as ethylene glycol, propylene glycol, polyethylene glycol, and the like; an alcohol compound such as methanol, ethanol, propanol, n-butanol, cyclohexanol, benzylalcohol, and the like; a solvent-based compound such propylene glycol methylethylacetate, N-methylpyrrolidone, and the like; a phosphorus compound such as triphenylphosphine, and the like; and an amine or ammonium salt compound such as tetramethylammonium chloride, tetraethylammonium bromide, benzyldiethylamine, triethylamine, tributylamine, benzyltriethylammonium chloride, and the like.

The cardo-based binder resin may have a weight average molecular weight of about 500 g/mol to about 50,000 g/mol, for example about 1,000 g/mol to about 30,000 g/mol. When the cardo-based binder resin has a weight average molecular weight within the above range, a pattern may be well formed with minimal or no residue during manufacture of a black column spacer and with minimal or no loss of a film thickness during development.

The photosensitive resin composition can include the cardo-based binder resin in an amount of about 1 wt % to about 20 wt %, for example about 1 wt % to about 15 wt %, for example about 1 wt % to about 10 wt %, based on the total amount (total weight, 100 wt %) of the photosensitive resin composition. In some embodiments, the photosensitive resin composition can include the cardo-based binder resin in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the cardo-based binder resin can be in a range from about any of the foregoing amounts to about any other of the foregoing amounts.

When the cardo-based binder resin is included in an amount within the above range, excellent sensitivity, developability, resolution, and/or pattern linearity may be obtained.

The acrylic-based binder resin is a copolymer of a first ethylenic unsaturated monomer and a second ethylenic unsaturated monomer that is copolymerizable therewith, and is a resin including at least one acrylic-based repeating unit.

The first ethylenic unsaturated monomer is an ethylenic unsaturated monomer including at least one carboxyl group. Examples of the monomer include without limitation (meth) acrylic acid, maleic acid, itaconic acid, fumaric acid, and the like, and combinations thereof.

The acrylic-based binder resin can include the first ethylenic unsaturated monomer in an amount of about 5 to about 50 wt %, for example about 10 to about 40 wt %, based on the total amount (total weight, 100 wt %) of the acrylic-based binder resin.

Examples of the second ethylenic unsaturated monomer can include without limitation aromatic vinyl compounds such as styrene, α-methylstyrene, vinyl toluene, vinylbenzylmethylether and the like; unsaturated carboxylate ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl(meth)acrylate, and the like; vinyl cyanide compounds such as (meth)acrylonitrile and the like; unsaturated amide compounds such as (meth)acrylamide, and the like; and the like. These may be used singularly or as a mixture of two or more.

Examples of the acrylic-based resin may include without limitation an acrylic acid/benzylmethacrylate copolymer, a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzyl methacrylate/styrene/2-hydroxyethylmethacrylate copolymer, and the like. These may be used singularly or as a mixture of two or more.

The photosensitive resin composition can include the acrylic-based binder resin in an amount of about 1 wt % to about 20 wt %, for example about 1 wt % to about 15 wt %, for example about 1 wt % to about 10 wt %, based on the total amount (total weight, 100 wt %) of the photosensitive resin composition. In some embodiments, the photosensitive resin composition can include the acrylic-based binder resin in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the acrylic-based binder resin can be in a range from about any of the foregoing amounts to about any other of the foregoing amounts.

When the acrylic-based binder resin is included in an amount within the above range, excellent sensitivity, developability, resolution, and/or pattern linearity may be realized.

When the cardo-based binder resin and the acrylic-based binder resin are included in the photosensitive resin composition, the cardo-based resin and the acrylic-based resin may be used in a weight ratio of about 99:1 to about 30:70, for example, about 95:5 to about 50:50. When the cardo-based binder resin and the acrylic-based binder resin are included in amounts within the above weight ratio range, excellent developability and/or sensitivity may be maintained, and a light-blocking layer pattern having excellent taper characteristics may be formed, while an undercut can be prevented.

The photosensitive resin composition can include the binder resin in an amount of about 5 wt % to about 20 wt %, for example about 7 wt % to about 15 wt %, based on the total amount (total weight, 100 wt %) of the photosensitive resin composition. In some embodiments, the photosensitive resin composition can include binder resin in an amount of about 5, 6, 7, 8, 9, 10, 11, 12, 13, 14, 15, 16, 17, 18, 19, or 20 wt %. Further, according to some embodiments of the present invention, the amount of the binder resin can be in a range from about any of the foregoing amounts to about any other of the foregoing amounts.

When the binder resin is included in an amount within the above range, excellent sensitivity, heat resistance, chemical resistance, and/or developability may be obtained.

(C) Photopolymerization Initiator

Examples of the photopolymerization initiator may include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound may include without limitation 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoylbenzoic acid, benzoylbenzoic acidmethyl, 4-phenylbenzophenone, hydroxybenzophenone, acrylatedbenzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-methylthioxanthone, isopropylthioxanthone, 2,4-diethylthioxanthone, 2,4-diisopropylthioxanthone, 2-chlorothioxanthon, and the like, and combinations thereof.

Examples of the benzoin-based compound may include without limitation benzoin, benzoinmethylether, benzoinethylether, benzoinisopropylether, benzoinisobutylether, benzyldimethylketal, and the like, and combinations thereof.

Examples of the triazine-based compound may include without limitation 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho1-yl)-4,6-bis(trichloromethyl)-s-triazine, 2-(4-methoxynaphtho1-yl)-4,6-bis(trichloromethyl)-s-triazine, 2-4-bis(trichloromethyl)-6- piperonyl-s-triazine, 2-4-bis(trichloromethyl)-6-(4-methoxystyryl)-s-triazine, and the like, and combinations thereof.

Examples of the oxime-based compound may include without limitation O-acyloxime-based compounds, 2-(O-benzoyloxime)-1-[4-(phenylthio)phenyl]-1,2-octandione, 1-(O-acetyloxime)-1-[9-ethyl-6-(2-methyl benzoyl)-9H-carbazol-3-yl]ethanone, O-ethoxycarbonyl-α-oxyamino-1-phenylpropan-1-one, and the like, and combinations thereof. Examples of the O-acyloxime-based compound may include without limitation 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione 2-oxime-O-benzoate, 1-(4-phenylsulfanyl phenyl)-octane-1,2-dione 2-oxime-O-benzoate, 1-(4-phenylsulfanyl phenyl)-octan-1-one oxime-O-acetate, 1-(4-phenylsulfanyl phenyl)-butan-1-one oxime-O-acetate, and the like, and combinations thereof.

The photopolymerization initiator may further include a carbazole-based compound, a diketone-based compound, a sulfonium borate-based compound, a diazo-based compound, an imidazole-based compound, and/or a biimidazole-based compound, and the like, in addition to or instead of the above compounds.

The photopolymerization initiator may be used with a photosensitizer capable of causing a chemical reaction by absorbing light and becoming excited and then, transferring its energy.

Examples of the photosensitizer may include without limitation tetraethylene glycol bis-3-mercapto propionate, pentaerythritol tetrakis-3-mercapto propionate, dipentaerythritol tetrakis-3-mercapto propionate, and the like, and combinations thereof.

The photosensitive resin composition can include the photopolymerization initiator in an amount of about 0.1 to about 5 wt %, for example about 0.1 to about 3 wt %, based on the total amount (total weight, 100 wt %) of the photosensitive resin composition. In some embodiments, the photosensitive resin composition can include the photopolymerization initiator in an amount of about 0.1, 0.2, 0.3, 0.4, 0.5, 0.6, 0.7, 0.8, 0.9, 1, 2, 3, 4, or 5 wt %. Further, according to some embodiments of the present invention, the amount of the photopolymerization initiator can be in a range from about any of the foregoing amounts to about any other of the foregoing amounts.

When the photopolymerization initiator is included in an amount within the above range, excellent reliability may be secured due to sufficiently curing during exposure in a pattern-forming process, a pattern may have excellent resolution and close-contacting (adhesive) properties as well as excellent heat resistance, light resistance, and/or chemical resistance, and/or deterioration of transmittance may be minimized or prevented due to non-reacted initiator.

(D) Photopolymerizable Monomer

The photopolymerizable monomer may be a mono-functional and/or multi-functional ester of (meth)acrylic acid including at least one ethylenic unsaturated double bond.

The photopolymerizable monomer has the ethylenic unsaturated double bond and thus may cause sufficient polymerization during exposure in a pattern-forming process and form a pattern that can have excellent heat resistance, light resistance, and/or chemical resistance.

ples of the photopolymerizable monomer may include without limitation ethylene glycoldi(meth)acrylate, diethylene glycoldi(meth)acrylate, triethylene glycoldi(meth)acrylate, propylene glycoldi(meth)acrylate, neopentylglycoldi(meth)acrylate, 1,4-butanedioldi(meth) acrylate, 1,6-hexanedioldi(meth)acrylate, bisphenol A di(meth)acrylate, pentaerythritoldi(meth)acrylate, pentaerythritoltri(meth)acrylate, pentaerythritoltetra(meth) acrylate, pentaerythritolhexa(meth)acrylate, dipentaerythritoldi(meth)acrylate, dipentaerythritoltri(meth) acrylate, dipentaerythritolpenta(meth)acrylate, dipentaerythritolhexa(meth)acrylate, bisphenol A epoxy(meth)acrylate, ethylene glycolmonomethylether (meth)acrylate, trimethylolpropanetri(meth)acrylate, tris(meth)acryloyloxyethylphosphate, novolacepoxy (meth)acrylate, and the like, and combinations thereof.

Commercially available examples of the photopolymerizable monomer include the following. The mono-functional (meth)acrylic acid ester may include without limitation Aronix M-101®, M-111®, and/or M-114® (Toagosei Chemistry Industry Co., Ltd.); KAYARAD TC-110S® and/or TC-120S® (Nippon Kayaku Co., Ltd.); V-158® and/or V-2311® (Osaka Organic Chemical Ind., Ltd.), and the like. Examples of a difunctional (meth)acrylic acid ester may include without limitation Aronix M-210®, M-240®, and/or M-6200® (Toagosei Chemistry Industry Co., Ltd.), KAYARAD HDDA®, HX-220®, and/or R-604® (Nippon Kayaku Co., Ltd.), V-260®, V-312®, and/or V-335 HP® (Osaka Organic Chemical Ind., Ltd.), and the like. Examples of a tri-functional (meth)acrylic acid ester may include without limitation Aronix M-309®, M-400®, M-405®, M-450®, M-7100®, M-8030®, and/or M-8060® (Toagosei Chemistry Industry Co., Ltd.), KAYARAD TMPTA®, DPCA-20®, DPCA-30®, DPCA-60®, and/or DPCA-120® (Nippon Kayaku Co., Ltd.), V-295®, V-300®, V-360®, V-GPT®, V-3PA®, and/or V-400® (Osaka Yuki Kayaku Kogyo Co. Ltd.), and the like. These may be used singularly or as a mixture of two or more.

The photopolymerizable monomer may be treated with acid anhydride to improve developability.

The photosensitive resin composition can include the photopolymerizable monomer in an amount of about 1 wt % to about 20 wt %, for example about 1 wt % to about 10 wt %, based on the total amount (total weight, 100 wt %) of the photosensitive resin composition. In some embodiments, the photosensitive resin composition can include photopolymerizable monomer in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the photopolymerizable monomer can be in a range from about any of the foregoing amounts to about any other of the foregoing amounts.

When the photopolymerizable monomer is included in an amount within the above range, the reactive unsaturated compound can be sufficiently cured during exposure in a pattern-forming process and can have excellent reliability and thus may form a pattern that can have excellent heat resistance, light resistance, and/or chemical resistance and also can have excellent resolution and/or close-contacting properties.

(E) Solvent

The solvent is a material having compatibility with the black colorant, the binder resin, the photopolymerization initiator and the photopolymerizable monomer but not reacting therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methyl-ethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxy acetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such 2-oxy-2-methyl methyl propionate, 2-oxy-2-methyl ethyl propionate, and the like; monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like; and combinations thereof. Additionally, a high boiling point solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like, and combinations thereof may be also used.

Considering miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol methylether acetate, propylene glycol propylether acetate and the like, and combinations thereof may be used.

The solvent is used in a balance amount, for example about 30 wt % to about 90 wt %, for example about 30 wt % to about 80 wt %, based on the total amount (total weight, 100 wt %) of the photosensitive resin composition. In some embodiments, the photosensitive resin composition can include the solvent in an amount of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the photosensitive resin composition may have an appropriate viscosity resulting in improvement of coating characteristics of a black column spacer.

(F) Epoxy-Based Monomer

The photosensitive resin composition may further include an epoxy-based monomer.

Examples of the epoxy-based monomer may include without limitation glycidyl (meth)acrylate, α-methylglycidyl (meth)acrylate, cycloaliphatic epoxy, and the like, and combinations thereof. The cycloaliphatic epoxy may be represented by the following Chemical Formula 3, but is not limited thereto:

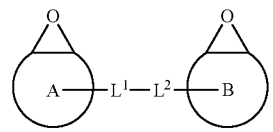

[Chemical Formula 3]

wherein, in Chemical Formula 3,

A and B are the same or different and are each independently a substituted or unsubstituted C3 to C10 cycloalkane, and $L^1$ and $L^2$ are the same or different and are each independently a single bond, a substituted or unsubstituted C1 to C10 alkylene group, or *—C(=O)O—*.

For example, the A and B may be independently a substituted or unsubstituted cyclohexane.

The photosensitive resin composition can include the epoxy-based monomer in an amount of about 0.1 wt % to about 5 wt %, for example about 1 wt % to about 3 wt %, based on the total amount (total weight, wt %) of the photosensitive resin composition. In this case, in a black column spacer manufacturing process, thermal curing may be additionally performed, and heat resistance, chemical resistance, and the like may become improved.

(G) Other Additive(s)

The photosensitive resin composition may further include one or more additives. Examples of the additives may include without limitation malonic acid; 3-amino-1,2-propanediol, silane-based coupling agents; leveling agents; fluorine-based surfactants; radical polymerization initiators; and the like, and combinations thereof.

The silane-based coupling agent may have a reactive substituent such as a vinyl group, a carboxyl group, a methacryloxy group, an isocyanate group, an epoxy group, and the like, in order to improve close-contacting properties with a substrate.

Examples of the silane-based coupling agent may include without limitation trimethoxysilylbenzoic acid, γ-methacryloxypropyltrimethoxysilane, vinyltriacetoxysilane, vinyltrimethoxysilane, γ-isocyanatepropyltriethoxysilane, γ-glycidoxypropyltrimethoxysilane, β-(3,4-epoxycyclohexyl)ethyltrimethoxysilane, and the like. These may be used singularly or in a mixture of two or more.

The silane-based coupling agent may be included in an amount of about 0.01 parts by weight to about 10 parts by weight based on about 100 parts by weight of the photosensitive resin composition. When the silane-based coupling agent is included in an amount within the above range, close-contacting properties, storage properties, and the like may be improved.

The photosensitive resin composition may further include a surfactant, for example a fluorine-based surfactant, in order to improve coating properties and prevent a defect if necessary.

Examples of the fluorine-based surfactant may include without limitation commercial fluorine-based surfactants such as BM-1000® and/or BM-1100® (BM Chemie Inc.); MEGAFACE F 142D®, F 172®, F 173®, F 183® and/or F 554® (Dainippon Ink Kagaku Kogyo Co., Ltd.); FULO-RAD FC-135®, FULORAD FC-170C®, FULORAD FC-430®, and/or FULORAD FC-431® (Sumitomo 3M Co., Ltd.); SURFLON S-112®, SURFLON S-113®, SURFLON S-131®, SURFLON S-141®, and/or SURFLON S-145® (Asahi Glass Co., Ltd.); SH-28PA®, SH-190®, SH-193®, SZ-6032®, and/or SF-8428® (Toray Silicone Co., Ltd.), and the like, and combinations thereof.

The fluorine-based surfactant may be used in an amount of about 0.001 to about 5 parts by weight based on about 100 parts by weight of the photosensitive resin composition. When the surfactant is included in an amount within the above range, excellent wetting on an IZO substrate or a glass substrate as well as coating uniformity may be secured, and/or a stain may not be produced.

Furthermore, the photosensitive resin composition may include one or more other additives such as but not limited to antioxidants, stabilizers, and the like in a predetermined amount unless they deteriorate properties of the photosensitive resin composition.

Another embodiment provides a black column spacer manufactured by exposure, development, and curing of the photosensitive resin composition.

A pattern in the black column spacer may have a tapered angle of greater than or equal to about 20°, for example greater than or equal to about 20° and less than or equal to about 60°.

An exemplary method of manufacturing the black column spacer is as follows.

(1) Coating and Film Formation

The photosensitive resin composition can be coated to have a desired thickness on a substrate such as a glass substrate or a IZO substrate which undergoes a predetermined pretreatment, using a spin coating, slit coating method, a roll coating method, a screen-printing method, an applicator method, and the like, and heated at about 70° C. to about 100° C. for 1 minute to 10 minutes through a VCD (vacuum dry) process to remove a solvent, forming a photosensitive resin film.

(2) Exposure

The photosensitive resin film can be patterned by disposing a mask consisting of a half tone part for realizing a black matrix pattern and a full tone for realizing a column spacer pattern and then radiating the film with (exposing the film to) an actinic ray with a wavelength ranging from about 200 nm to about 500 nm. The radiation can be performed by using a light source such as a mercury lamp with a low pressure, a high pressure, or an ultrahigh pressure, a metal halide lamp, an argon gas laser, and the like. An X ray, an electron beam, and the like may be also used.

The exposure process can use, for example, a light dose of about 500 mJ/cm$^2$ or less (with a 365 nm sensor) when a high pressure mercury lamp is used. However, the light dose may vary depending on the types of each component, combination ratios, and a dry film thickness.

(3) Development

After the exposure process, an alkali aqueous solution can be used to develop the exposed film by dissolving and removing an unnecessary part except the exposed part, forming a pattern.

(4) Post-Treatment

The developed image pattern may be post-heated in order to accomplish excellent quality in terms of heat resistance, photo resistance, close contacting properties, crack-resistance, chemical resistance, high strength, storage stability, and the like.

Another embodiment provides a color filter including the black column spacer.

Hereinafter, the present invention is illustrated in more detail with reference to the following examples. These examples, however, are not in any sense to be interpreted as limiting the scope of the invention.

EXAMPLE

Preparation of Photosensitive Resin Composition

Example 1

A photopolymerization initiator is dissolved in a solvent in a composition provided in Table 1, and the solution is stirred at room temperature for 2 hours. Subsequently, a binder resin and a photopolymerizable monomer (and an epoxy-based monomer) are added thereto, and the mixture is stirred again at room temperature for 2 hours. Then, a colorant (a mixed black colorant) is added thereto, the mixture is stirred at room temperature for one hour, a silane-based coupling agent is added thereto, and the obtained mixture is stirred at room temperature for one hour. The resulting solution is three times filtered to remove impurities, preparing a photosensitive resin composition according to Example 1.

TABLE 1

| | Components | Amounts |
|---|---|---|
| | (unit: g) | |
| Binder resin | cardo-based binder resin (KBR101, Kyung-In Synthetic Corp.) | 4.95 |
| | acrylic-based binder resin (BX-04, Japan Catalyst Company) | 4.95 |
| Photopolymerizable monomer | dipentaerythritolhexaacrylate (Japan Catalyst Company) | 4.24 |
| Photopolymerization initiator | OXE01 (BASF) | 0.47 |
| Epoxy-based monomer | celloxide 2021P (Daicel) | 1.09 |
| Colorant | 200R (Red R254 Millbase, ENF) | 12.0 |
| | 100Y (Yellow Y139 Millbase, ENF) | 0.50 |
| | 150B (blue 15:6 Millbase, ENF) | 8.0 |
| Solvent | PGMEA | 47.56 |
| | EDM | 15.5 |
| Other additives | γ-glycidoxy propyl trimethoxysilane (S-510, Chisso Corp.) | 0.74 |

Comparative Example 1

A photosensitive resin composition according to Comparative Example 1 is prepared according to the same method as Example 1 except for using the following components in a composition provided in Table 2.

TABLE 2

(unit: g)

| Components | | Amounts |
|---|---|---|
| Binder resin | cardo-based binder resin (KBR101, Kyung-In Synthetic Corporation) | 4.98 |
| | acrylic-based binder resin (BX-04, Japan Catalyst Company) | 4.98 |
| Photopolymerizable monomer | dipentaerythritolhexaacrylate (Japan Catalyst Company) | 4.27 |
| Photopolymerization initiator | OXE01 (BASF) | 0.47 |
| Black colorant | carbon black-containing Mill base (Tokushiki) | 12.25 |
| Solvent | PGMEA | 56.81 |
| | EDM | 15.5 |
| Other additives | γ-glycidoxy propyl trimethoxysilane (S-510, Chisso Corp.) | 0.74 |

Comparative Example 2

A photosensitive resin composition according to Comparative Example 2 is prepared according to the same method as Example 1 except for using the following components in a composition provided in Table 3.

TABLE 3

(unit: g)

| Components | | Amounts |
|---|---|---|
| Binder resin | cardo-based binder resin (KBR101, Kyung-In Synthetic Corp.) | 4.98 |
| | acrylic-based binder resin (BX-04, Japan Catalyst Company) | 4.98 |
| Photopolymerizable monomer | dipentaerythritolhexaacrylate (Japan Catalyst Company) | 4.27 |
| Photopolymerization initiator | OXE01 (BASF) | 0.47 |
| Black colorant | OBP (organic black pigment)-containing Mill base (Sakata) | 18.25 |
| Solvent | PGMEA | 50.81 |
| | EDM | 15.5 |
| Other additive | γ-glycidoxy propyl trimethoxysilane (S-510, Chisso Corp.) | 0.74 |

Evaluation 1: Transmittance

The compositions according to Example 1 and Comparative Examples 1 and 2 are respectively coated to be 3.0 μm thick on a 10 cm*10 cm glass by using a spin coater (Opticoat MS-A150, Mikasa Co., Ltd.) and soft-baked (or pre-baked) on a hot-plate at 80° C. for 150 seconds, and then, their transmittance is measured, and the results are provided in Table 4.

TABLE 4

| | Example 1 | Comparative Example 1 | Comparative Example 2 |
|---|---|---|---|
| Maximum transmittance in an ultraviolet (UV) wavelength range (%) | 9.8 | 0.02 | 0.4 |
| Minimum transmittance in a visible ray wavelength range (%) | 0.03 | 0.02 | 0.3 |

Evaluation 2: Optical Density

The photosensitive resin compositions according to Example 1 and Comparative Examples 1 and 2 are respectively coated to be 1.3 μm thick on a 10 cm*10 cm IZO substrate with a spin coater (Opticoat MS-A150, Mikasa Co., Ltd.), soft-baked (or pre-baked) on a hot-plate at 80° C. for 150 seconds, and exposed with 50 mJ by using an exposer (HB-50110AA, Ushio Inc.) and a photo mask. Subsequently, the obtained organic coating layers (SSP-200, SVS Corp.) are respectively developed in a 0.2 wt % potassium hydroxide (KOH) aqueous solution for 150 seconds and hard-baked (or post-baked) in an oven at 230° C. for 30 minutes, obtaining each patterned glass specimen.

Then, optical density (550 nm, 3 μm) of the photosensitive resin compositions after the exposure is measured by using X-rite, and the results are provided in Table 5.

TABLE 5

| | Example 1 | Comparative Example 1 | Comparative Example 2 |
|---|---|---|---|
| Optical density (OD) | 2.1 | 2.1 | 2.1 |

Referring to Table 3, the photosensitive resin compositions according to Example 1 and Comparative Examples 1 and 2 have the same optical density.

Evaluation 3: CD Measurement

Figure 3:
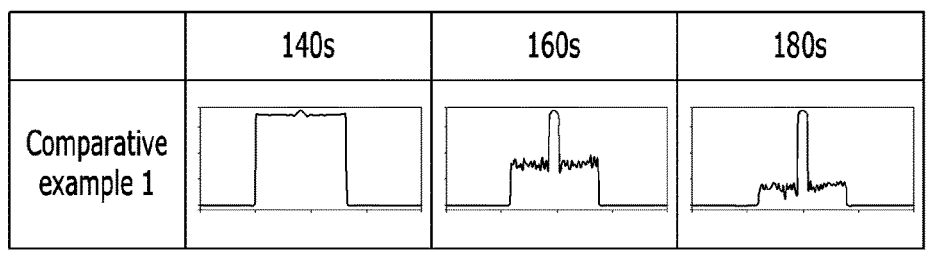
FIG. 3 includes image photographs CD of the photosensitive resin film manufactured using the photosensitive resin composition of Comparative Example 1 measured using a 130 sec, 150 sec, and 170 sec 3-D profiler.
Figure 4:
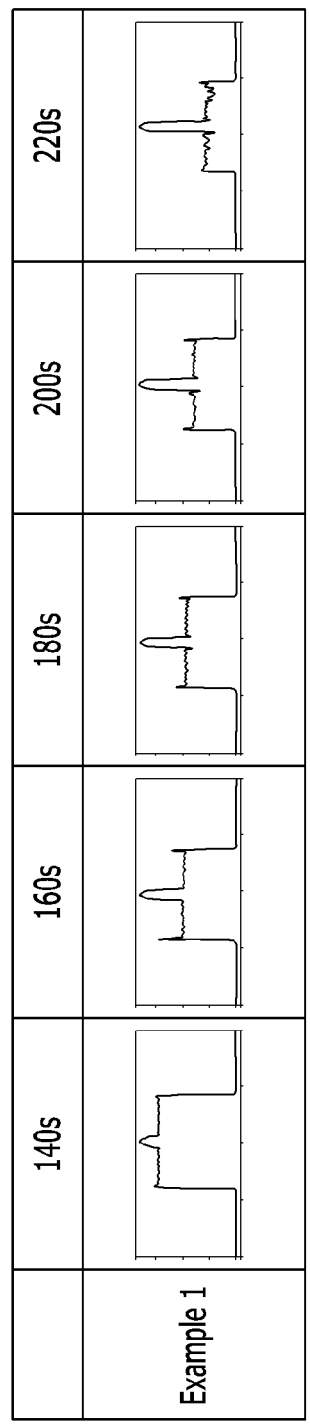
FIG. 4 includes image photographs CD of the photosensitive resin film manufactured using the photosensitive resin composition of Example 1 measured using a 140 sec, 160 sec, 180 sec, 200 sec and 220 sec 3-D profiler.

The step thickness of a 10 μm patterned light-blocking layer among the column spacer patterns of the patterned specimens in Evaluation 2 is measured with a non-contact type thickness meter (a 3-D profiler), and the results are provided in FIGS. 3 and 4.

Referring to Table 5 and FIGS. 3 and 4, the photosensitive resin composition of Example 1 has the same optical density but an excellent developing margin through a halftone process compared with the photosensitive resin compositions of Comparative Examples 1 and 2.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way. Although specific terms are employed herein, they are used in a generic and descriptive sense only and not for purposes of limitation, the scope of the invention being defined in the claims.

What is claimed is:

1. A photosensitive resin composition comprising:
   (A) a black colorant having a maximum transmittance in an ultraviolet (UV) wavelength range/minimum transmittance in a visible ray wavelength range of about 30 or greater;
   (B) a binder resin comprising a cardo-based binder resin and an acrylic-based binder resin;
   (C) a photopolymerization initiator;
   (D) a photopolymerizable monomer;
   (E) a solvent; and
   an epoxy-based monomer represented by Chemical Formula 3:

[Chemical Formula 3]

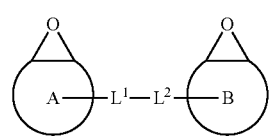

wherein, in Chemical Formula 3,

A and B are the same or different and are each independently a substituted or unsubstituted $C_3$ to $C_{10}$ cycloalkane, and $L^1$ and $L^2$ are the same or different and are each independently a single bond, a substituted or unsubstituted $C_1$ to $C_{10}$ alkylene group, or *—C(=O)O—*.

2. The photosensitive resin composition of claim 1, wherein the ultraviolet (UV) wavelength range is about 300 nm to about 400 nm.

3. The photosensitive resin composition of claim 1, wherein the visible ray wavelength range is about 500 nm to about 600 nm.

4. The photosensitive resin composition of claim 1, wherein the maximum transmittance in an ultraviolet (UV) wavelength range is greater than or equal to about 3%.

5. The photosensitive resin composition of claim 1, wherein the minimum transmittance in a visible ray wavelength range is less than or equal to about 0.1%.

6. The photosensitive resin composition of claim 1, wherein the black colorant is a mixture of two or more colorants selected from a red colorant, green colorant, a blue colorant, and/or a yellow colorant.

7. The photosensitive resin composition of claim 6, wherein the red colorant, green colorant, blue colorant, violet colorant and/or yellow colorant are each independently a pigment and/or a dye.

8. The photosensitive resin composition of claim 1, comprising the epoxy-based monomer in an amount of about 0.1 wt % to about 5 wt % based on the total amount of the photosensitive resin composition.

9. The photosensitive resin composition of claim 1, wherein the photosensitive resin composition comprises:
   about 5 wt % to about 20 wt % of the black colorant;
   about 5 wt % to about 20 wt % of the binder resin;
   about 0.1 wt % to about 5 wt % of the photopolymerization initiator;
   about 1 wt % to about 10 wt % of the photopolymerizable monomer; and
   a balance amount of the solvent
   each based on the total amount of the photosensitive resin composition.

10. The photosensitive resin composition of claim 1, wherein the photosensitive resin composition further comprises malonic acid, 3-amino-1,2-propanediol, a silane-based coupling agent, a leveling agent, a fluorine-based surfactant, a radical polymerization initiator, or a combination thereof.

11. A black column spacer manufactured using the photosensitive resin composition of claim 1.

12. A color filter comprising the black column spacer of claim 11.

* * * * *